(12) United States Patent
Do et al.

(10) Patent No.: US 9,293,351 B2
(45) Date of Patent: Mar. 22, 2016

(54) INTEGRATED CIRCUIT PACKAGING SYSTEM WITH PLANARITY CONTROL AND METHOD OF MANUFACTURE THEREOF

(75) Inventors: Byung Tai Do, Singapore (SG); Arnel Senosa Trasporto, Singapore (SG); Linda Pei Ee Chua, Singapore (SG); Emmanuel Espiritu, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 26 days.

(21) Appl. No.: 13/526,802

(22) Filed: Jun. 19, 2012

(65) Prior Publication Data

US 2013/0099367 A1    Apr. 25, 2013

Related U.S. Application Data

(60) Provisional application No. 61/549,347, filed on Oct. 20, 2011.

(51) Int. Cl.
*H01L 21/44* (2006.01)
*H01L 21/48* (2006.01)
(Continued)

(52) U.S. Cl.
CPC .......... *H01L 21/568* (2013.01); *H01L 21/4832* (2013.01); *H01L 23/49548* (2013.01); *H01L 23/49575* (2013.01); *H01L 23/49582* (2013.01); *H01L 2224/16245* (2013.01); *H01L 2224/32145* (2013.01); *H01L 2224/32245* (2013.01); *H01L 2224/48247* (2013.01); *H01L 2224/73265* (2013.01); *H01L 2924/10253* (2013.01); *H01L 2924/15311* (2013.01); *H01L 2924/18161* (2013.01); *Y10T 29/4921* (2015.01)

(58) Field of Classification Search
CPC ....... H01L 21/44; H01L 23/495; H01L 21/48; H01L 21/50; H01L 21/302; H01L 21/469
USPC .......... 257/787, 678, 666, 668, E23.069, 737, 257/738, 700, 701, 702, E23.119, E23.015; 438/114, 113, 106, 123, 459, 759, 940, 438/977
See application file for complete search history.

(56) References Cited

U.S. PATENT DOCUMENTS 6,700,210 B1    3/2004    Smith
7,060,535 B1 *  6/2006    Sirinorakul et al. .......... 438/123
(Continued)

OTHER PUBLICATIONS

U.S. Appl. No. 13/102,041, filed May 5, 2011, Do et al.
(Continued)

*Primary Examiner* — David Vu
*Assistant Examiner* — Mouloucoulaye Inoussa
(74) *Attorney, Agent, or Firm* — Ishimaru & Associates LLP

(57) ABSTRACT

A method of manufacture of an integrated circuit packaging system includes: providing a leadframe having a partially removed portion including: a conductive pattern having a lower surface on a top frame surface of the leadframe, a contact protrusion and a support lead on the lower surface of the conductive pattern, the support lead for supporting the partially removed portion of the leadframe during an encapsulation process, and a contact pad on a bottom surface of the contact protrusion; mounting an integrated circuit die above the conductive pattern; applying an encapsulation on the integrated circuit die and the conductive pattern, the lower surface of the conductive pattern exposed from the encapsulation; and removing at least a portion of the leadframe to form a contact lead and expose a bottom surface of the encapsulation.

20 Claims, 3 Drawing Sheets

(51) Int. Cl.
*H01L 21/56* (2006.01)
*H01L 23/495* (2006.01)

(56) References Cited

U.S. PATENT DOCUMENTS 7,892,894 B2 2/2011 Do et al.
7,964,450 B2 6/2011 Camacho et al.

2008/0268578 A1* 10/2008 Shimanuki et al. ........... 438/124
2009/0034225 A1 2/2009 Shoji et al.
2010/0314741 A1 12/2010 Lee et al.

OTHER PUBLICATIONS

U.S. Appl. No. 13/326,806, filed Dec. 15, 2011, Do et al.

* cited by examiner

INTEGRATED CIRCUIT PACKAGING SYSTEM WITH PLANARITY CONTROL AND METHOD OF MANUFACTURE THEREOF

CROSS-REFERENCE TO RELATED APPLICATION(S)

This application claims the benefit of U.S. Provisional Patent Application Ser. No. 61/549,347 filed Oct. 20, 2011, and the subject matter thereof is incorporated herein by reference thereto.

TECHNICAL FIELD

The present invention relates generally to an integrated circuit packaging system, and more particularly to a system with planarity control.

BACKGROUND ART

Electronic products have become an integral part of our daily lives. This has created a consistent if not increasing expectation for new features, higher speed, more data, improved portability, etc. These demands have driven the development of electronic technology to reduce size, improve utility, and increase performance of the integrated circuit devices in an ever-increasing range of products such as cell phones, music players, televisions, and automobiles.

Packages of components such as semiconductor circuits, transistors, diodes, and other electronic devices must also become smaller and thinner with more functions and connections. Many conventional semiconductor (or "chip") packages are of the type where a semiconductor die is molded into a package with a resin, such as an epoxy molding compound, under high pressure. As the size of components decrease and density increases, manufacturing defects can increase.

Thus, a need still remains for a reliable manufacturing method. In view of the decreasing size and strength of components, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a leadframe having a partially removed portion including: a conductive pattern having a lower surface on a top frame surface of the leadframe, a contact protrusion and a support lead on the lower surface of the conductive pattern, the support lead for supporting the partially removed portion of the leadframe during an encapsulation process, and a contact pad on a bottom surface of the contact protrusion; mounting an integrated circuit die above the conductive pattern; applying an encapsulation on the integrated circuit die and the conductive pattern, the lower surface of the conductive pattern exposed from the encapsulation; and removing at least a portion of the leadframe to form a contact lead and expose a bottom surface of the encapsulation.

The present invention provides an integrated circuit packaging system, including: a conductive pattern having a lower surface; an integrated circuit die mounted above the conductive pattern; an encapsulation on the integrated circuit die and the conductive pattern, the lower surface of the conductive pattern exposed from a bottom surface of the encapsulation having a textured surface characteristic of a removal process; and a contact lead, having a contact pad on a bottom surface of the contact lead, on the lower surface of the conductive pattern, a side of the contact lead having a textured surface characteristic of a removal process.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
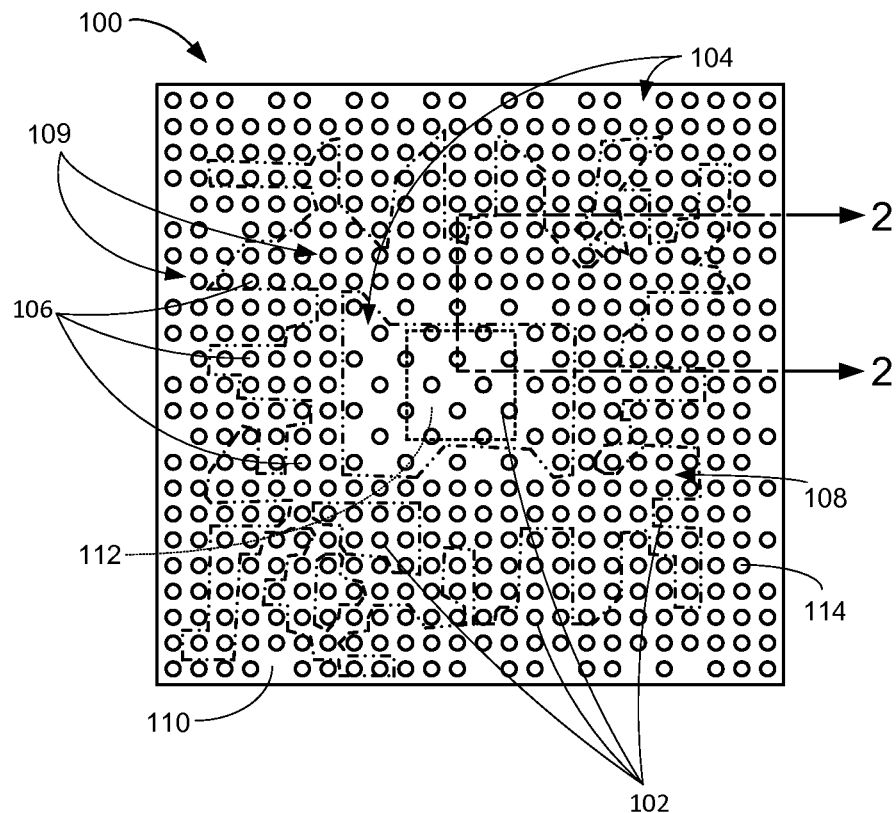
FIG. 1 is a bottom view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or contact surface of the contact pad, regardless of their orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements. The term "directly on" means that there is direct contact between one element and another element without an intervening element. The term "processing" as used herein includes deposition of material or photoresist, patterning, exposure, development, etching, cleaning, and/or removal of the material or photoresist as required in forming a described structure.

Referring now to FIG. 1, therein is shown a bottom view of an integrated circuit packaging system 100 in a first embodiment of the present invention. The integrated circuit packaging system 100 is shown having contact leads 102 in a contact lead area 104, lead bumps 106 in a recessed area 108, an encapsulation 110, and an integrated circuit die 112. The contact leads 102 in the contact lead area 104 and the lead bumps 106 in the recessed area 108 can together be an external lead array 109, which covers the bottom surface of the integrated circuit packaging system 100.

The contact lead area 104 is a region on the bottom of the integrated circuit packaging system 100 containing the contact leads 102, and is external to the region delineated by the dash-dot-dot-dash line. The contact lead area 104 can surround the recessed area 108 and can be discontinuous. For example, a portion of the contact lead area 104 can be surrounded by the recessed area 108, which is indicated by the dash-dot-dot-dash line, while another portion of the contact lead area 104 can surround the recessed area 108. The contact lead area 104 can contain an array of the contact leads 102. Each of the contact leads 102 can have a contact pad 114 preferably formed from a conductive material resistant to etching.

For illustrative purposes, the array of the contact leads 102 are shown in an irregular pattern with spacing that varies depending on the location of the contact leads 102, though it is understood that the array of the contact leads 102 can be in any configuration, in any location within the contact lead area 104, and with any kind of spacing. For example, the array of the contact leads 102 can be in a regular or staggered pattern within the contact lead area 104.

The recessed area 108 is a region on the bottom of the integrated circuit packaging system 100 without the contact pad 114. The recessed area 108 can contain an array of the lead bumps 106. The lead bumps 106 are defined as a structure made from the same material as the contact leads 102. For example, the lead bumps 106 can be remnants of a removal process halted at a predefined point. Also for example, the lead bumps 106 can have no plating on an external surface of the lead bumps 106.

As an example, the lead bumps 106 can be in any region between the contact leads 102 with a spacing between the contact leads 102 greater than 0.65 mm. This example assumes that the contact leads 102 have a pitch of 0.50 mm given a 0.35 mm horizontal size of each of the contact leads 102, and a thickness of about 0.102 mm, with a molding pressure during application of the encapsulation 110 of 0.8 to 1.3 tons. In other words, the lead bumps 106 can be in any region between the contact leads 102 larger than the space than would be taken up by one of the contact leads 102.

For illustrative purposes, the array of the lead bumps 106 is shown in an irregular pattern with regular spacing, though it is understood that the array of the lead bumps 106 can be in any pattern, with any range of spacing. For example, the array of the lead bumps 106 can be in a staggered or irregular pattern within the recessed area 108. The lead bumps 106 can be electrically isolated from each other.

Also for illustrative purposes, the recessed area 108 is shown with the lead bumps 106, though it is understood that the recessed area 108 can be configured differently. For example, the recessed area 108 can be free of both the contact leads 102 and the lead bumps 106, and can leave exposed conductive traces and the encapsulation 110.

For illustrative purposes, the contact lead area 104 and the recessed area 108 are shown with an irregular shape, though it is understood that the contact lead area 104 and the recessed area 108 can have any shape.

Also for illustrative purposes, the contact leads 102 and the lead bumps 106 are shown as circular, though it is understood that the contact leads 102 and the lead bumps 106 can have any shape. For example, the contact leads 102 and the lead bumps 106 can be in an irregular or any geometric shape such as rectangular, elliptical, or trapezoidal. Also for example, the spacing of the lead bumps 106 can be 0.15 mm or less, and the size of the lead bumps 106 can range from 50 to 100 μm. This example assumes that the contact leads 102 have a pitch of 0.50 mm given a 0.35 mm horizontal size of each of the contact leads 102, and a thickness of about 0.102 mm, with a molding pressure during application of the encapsulation 110 of 0.8 to 1.3 tons.

Also for illustrative purposes, the contact leads 102 and the lead bumps 106 are shown as the same size though it is understood that the contact leads 102 and the lead bumps 106 can be different sizes. For example, the lead bumps 106 can be smaller than the contact leads 102.

The encapsulation 110 is defined as a cover that provides a hermetic seal protecting internal components from the outside environment. The encapsulation 110 can be exposed between the lead bumps 106 and the contact leads 102 and the exposed surface of the encapsulation 110 can be planar whether in the contact lead area 104 or the recessed area 108.

The integrated circuit die 112 can be mounted within the integrated circuit packaging system 100 and can be covered by the encapsulation 110. The integrated circuit die 112 is represented in this example as an internal object depicted by a dotted line in the shape of a square. The integrated circuit die 112 can be connected to the contact leads 102, the lead bumps 106, or a combination thereof through internal interconnects and traces.

For illustrative purposes, the integrated circuit die 112 is shown as within the contact lead area 104, though it is understood that the integrated circuit die 112 can be in any location. For example, the integrated circuit die 112 can overlap both the contact lead area 104 and the recessed area 108, or the integrated circuit die 112 can be located entirely within the recessed area 108. Also for example, if located partially or fully over the recessed area 108, the integrated circuit die 112 can provide rigidity to the external lead array 109, allowing the contact leads 102 to be spaced farther from each other. As another example, if the integrated circuit die 112 is an ultra-thin die, the external lead array 109 under the integrated circuit die 112 can be densely populated by the contact leads and/or the lead bumps 106 to provide greater rigidity to the external lead array 109 to protect the integrated circuit die 112.

Figure 2:
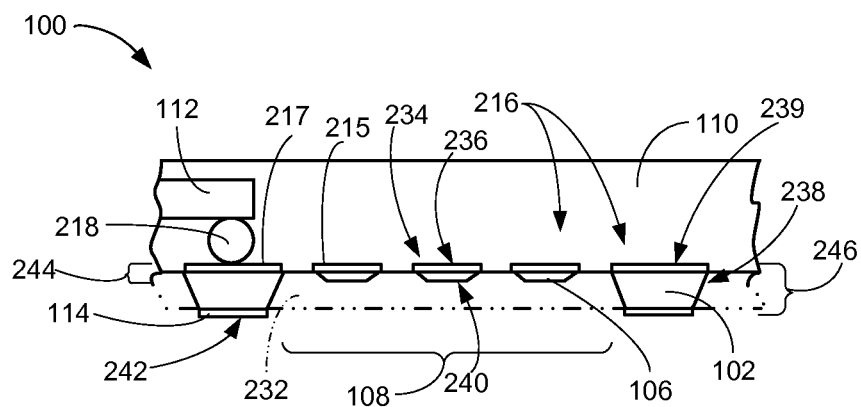
FIG. 2 is a cross-sectional view of a portion of the integrated circuit packaging system along the section line 2-2 of FIG. 1.

Referring now to FIG. 2, therein is shown a cross-sectional view of a portion of the integrated circuit packaging system 100 along the section line 2-2 of FIG. 1. The integrated circuit packaging system 100 is shown having the contact leads 102, the lead bumps 106, the encapsulation 110, and a conductive pattern 216.

Each of the contact leads 102 can include the contact pad 114 on a bottom surface of the contact leads 102. The contact leads 102 can include non-horizontal sides characteristic of a removal process. For example, the sides of the contact leads 102 can be wider at the top than the bottom and curved because of an etching process and the resistance of the contact pad 114 to the etching process. Also for example, the sides of the contact leads 102 can have a textured surface characteristic of a chemical etching process. Some of the contact leads 102 be laterally spaced away from the integrated circuit die 112 such that the contact leads 102 do not share any vertical space.

The lead bumps 106 are physically and electrically isolated from each other. The lead bumps 106 can be in the recessed area 108 between the contact leads 102. The lead bumps 106 do not extend away from the encapsulation 110 as far as the contact leads 102. The lead bumps 106 can have physical characteristics of a removal process. For example, the lead bumps 106 can have tooling marks, a rough or patterned surface, scratches, or burned or melted portions due to a removal process such as grinding, sawing, etching, or laser ablation. Also for example, the lead bumps 106 can have a convex shape and a textured surface characteristic of a chemical etching process.

The conductive pattern 216 is defined as a patterned conductive structure for redistribution of electrical signals, references, levels, or a combination thereof. The conductive pattern 216 can be in direct contact with the contact leads 102 and the lead bumps 106. The conductive pattern 216 can include traces 215 and pads 217. The traces 215 can redistribute electrical signals between the pads 217. Trace structures 234 can include the traces 215 and the lead bumps 106. The trace structures 234 have a trace top surface 236 in direct contact with the encapsulation 110. Contact structures 238 can include the pads 217, the contact leads 102, and the contact pads 114. The contact structures 238 have a contact top surface 239 coplanar with the trace top surface 236. The trace structures 234 have a trace lower surface 240 exposed from the encapsulation 110. The contact structures 238 have a contact lower surface 242 extending beyond the trace lower surface 240. A trace thickness 244 of the trace structures 234 is less than a contact thickness 246 of the contact structure 238.

For illustrative purposes, the traces 215 and the pads 217 are shown in specific locations, though it is understood that the traces 215 and the pads 217 can be in any location and any configuration. For example, all of the conductive pattern 216 in FIG. 2 can be the pads 217, or the traces 215 can be only in locations spaced away from the contact leads 102.

For illustrative purposes, the conductive pattern 216 is shown directly above each of the lead bumps 106, though it is understood that the conductive pattern 216 can have a different configuration. For example, the conductive pattern 216 does not need to correspond to the lead bumps 106, and the lead bumps 106 can be positioned to not contact the conductive pattern 216 at all.

The conductive pattern 216 can be in direct physical contact with and electrically connected with the contact leads 102 and the lead bumps 106 at a lower surface of the conductive pattern 216. Within the recessed area 108, the lower surface of the conductive pattern 216 can be coplanar with a bottom surface of the encapsulation 110, which can be planar. The conductive pattern 216 is embedded in the encapsulation 110 and exposed from the encapsulation 110 at the bottom surface of the encapsulation 110.

The encapsulation 110 can cover the integrated circuit die 112 and contact the conductive pattern 216. The integrated circuit die 112 can connect to the conductive pattern 216 through internal interconnects 218, also covered by the encapsulation 110. In this example, one of the internal interconnects 218 is shown as a solder ball, though it is understood that the internal interconnects 218 could be any other kind of connector.

The bottom surface of the encapsulation 110 can have physical characteristics of a removal process. For example, the bottom surface of the encapsulation 110 can have a rough or patterned surface, or burned or melted portions due to a removal process such as etching or laser ablation, respectively. Also for example, the bottom surface of the encapsulation 110 between portions of the conductive pattern 216 can be recessed or indented due to an etching process. As another example, the bottom surface of the encapsulation 110 can have a textured surface characteristic of a chemical etching process.

For illustrative purposes, the integrated circuit die 112 is shown as a flip chip though it is understood that the integrated circuit die 112 could be any different kind of chip. For example, the integrated circuit die 112 could be a wire-bond die, and could attach to the conductive pattern 216 via bond wires rather than solder balls.

A dielectric layer 232 can cover the recessed area 108. A dash-dot-dot-dash line can represent the extent of the dielectric layer 232, which is optionally applied. For example, the dielectric layer 232 can be a liquid encapsulant or trace protection material such as a solder mask. The dielectric layer 232 can cover the bottom surface of the encapsulation 110, the lead bumps 106, and at least a portion of the sides of the contact leads 102.

For illustrative purposes, the dielectric layer 232 is shown as in contact with the sides of the contact leads 102 but not the contact pad 114, though it is understood that the dielectric layer 232 can be in any other configuration. For example, the bottom of the dielectric layer 232 can be coplanar with the bottom of the contact pad 114, or the dielectric layer 232 can expose a portion of the sides of the contact leads 102.

It has been discovered that the lead bumps 106 remaining between the contact leads 102 is a result of preventing overetching of the contact leads 102 so that the contact leads 102 retain more conductive material, improving signal quality.

Figure 3:
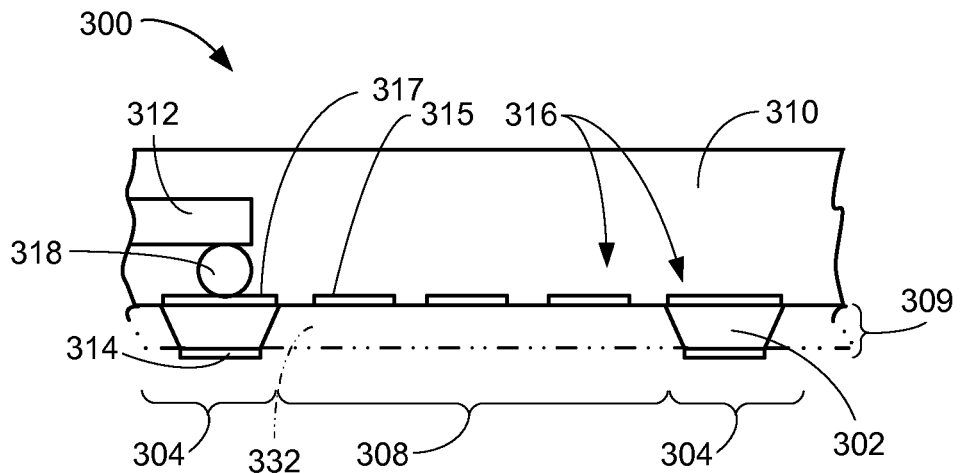
FIG. 3 is a cross-sectional view of a portion of an integrated circuit packaging system as exemplified by the bottom plan view of FIG. 1 and along the section line 2-2 of FIG. 1 in a second embodiment of the present invention.

Referring now to FIG. 3, therein is shown a cross-sectional view of a portion of an integrated circuit packaging system 300 as exemplified by the bottom plan view of FIG. 1 and along the section line 2-2 of FIG. 1 in a second embodiment of the present invention. The integrated circuit packaging system 300 is shown having contact leads 302 in a contact lead area 304, a conductive pattern 316 exposed in a recessed area 308, and an encapsulation 310.

The contact lead area 304 is a region on the bottom of the integrated circuit packaging system 300 containing the contact leads 302. The contact lead area 304 can surround the recessed area 308 and can be discontinuous. For example, a portion of the contact lead area 304 can be surrounded by the recessed area 308, while another portion of the contact lead area 304 can surround the recessed area 308. The contact lead area 304 can contain an array of the contact leads 302. The contact leads 302 in the contact lead area 304 and the spaces between the contact leads 302 in the recessed area 308 together can be an external lead array 309, which covers the bottom surface of the integrated circuit packaging system 300.

Each of the contact leads 302 can include the contact pad 314 on a bottom surface of the contact leads 302. The contact pad 314 is preferably formed from a conductive material resistant to etching. The contact leads 302 can include non-horizontal sides characteristic of a removal process. For example, the sides of the contact leads 302 can be wider at the top than the bottom and curved because of an etching process and the resistance of the contact pad 314 to the etching process. Also for example, the sides of the contact leads 302 can have a textured surface characteristic of a chemical etching process.

The conductive pattern 316 can be exposed in the recessed area 308 between the contact leads 302. The recessed area 308 is a region on the bottom of the integrated circuit packaging system 300 without the contact pad 314. The conductive pattern 316 is defined as a patterned conductive structure for redistribution of electrical signals, references, levels, or a combination thereof. The conductive pattern 316 can be in direct contact with the contact leads 302. The conductive pattern 316 can include traces 315 and pads 317.

For illustrative purposes, the traces 315 and the pads 317 are shown in specific locations, though it is understood that the traces 315 and the pads 317 can be in any location and any configuration. For example, all of the conductive pattern 316 in FIG. 3 can be the pads 317, or the traces 315 can be only in locations spaced away from the contact leads 302.

For illustrative purposes, the recessed area 308 is shown surrounded by the contact lead area 304 though it is understood that they can be in any other configuration. For example, the recessed area 308 can surround the contact lead area 304 or the recessed area 308 and the contact lead area 304 can be interleaved.

The conductive pattern 316 can be in direct physical contact with and electrically connected with the contact leads 302 at a lower surface of the conductive pattern 316. Within the recessed area 308, the lower surface of the conductive pattern 316 can be coplanar with a bottom surface of the encapsulation 310, which can be planar. The conductive pattern 316 is embedded in the encapsulation 310 and exposed from the encapsulation 310 at a bottom surface of the encapsulation 310.

The integrated circuit die 312 can connect to the conductive pattern 316 through internal interconnects 318, also covered by the encapsulation 310. In this example, one of the internal interconnects 318 is shown as a solder ball, though it is understood that the internal interconnects 318 could be any other kind of connectors.

The encapsulation 310 can cover the integrated circuit die 312 and contact the conductive pattern 316. The encapsulation 310 is defined as a cover that provides a hermetic seal protecting components from the outside environment.

A bottom surface of the encapsulation 310 can have physical characteristics of a removal process. For example, the bottom surface of the encapsulation 310 can have a rough or patterned surface, or burned or melted portions due to a removal process such as etching or laser ablation, respectively. Also for example, the bottom surface of the encapsulation 310 between portions of the conductive pattern 316 can be recessed or indented due to an etching process. As another example, the bottom surface of the encapsulation 310 can have a textured surface characteristic of a chemical etching process.

For illustrative purposes, the integrated circuit die 312 is shown as a flip chip though it is understood that the integrated circuit die 312 could be any different kind of chip. For example, the integrated circuit die 312 could be a wire-bond die, and could attach to the conductive pattern 316 via bond wires rather than solder balls.

For illustrative purposes, the integrated circuit die 312 is shown as over the contact lead area 304, though it is understood that the integrated circuit die 312 can be in any location. For example, the integrated circuit die 312 can overlap both the contact lead area 304 and the recessed area 308, or the integrated circuit die 312 can be located entirely over the recessed area 308. Also for example, if located partially or fully over the recessed area 308, the integrated circuit die 312 can provide rigidity to the external lead array 309, allowing the contact leads 302 to be spaced farther from each other. As another example, if the integrated circuit die 312 is an ultra-thin die, the external lead array 309 under the integrated circuit die 312 can be densely populated by the contact leads to provide greater rigidity to the external lead array 309 to protect the integrated circuit die 312.

A dielectric layer 332 can cover the recessed area 308. A dash-dot-dot-dash line can represent the extent of the dielectric layer 332, which is optionally applied. For example, the dielectric layer 332 can be a liquid encapsulant or trace protection material such as a solder mask. The dielectric layer 332 can cover the bottom surface of the encapsulation 310, the conductive pattern 316, and at least a portion of the sides of the contact leads 302.

For illustrative purposes, the dielectric layer 332 is shown as in contact with the sides of the contact leads 302 but not the contact pad 314, though it is understood that the dielectric layer 332 can be in any other configuration. For example, the bottom of the dielectric layer 332 can be coplanar with the bottom of the contact pad 314, or the dielectric layer 332 can expose a portion of the sides of the contact leads 302.

Figure 4:
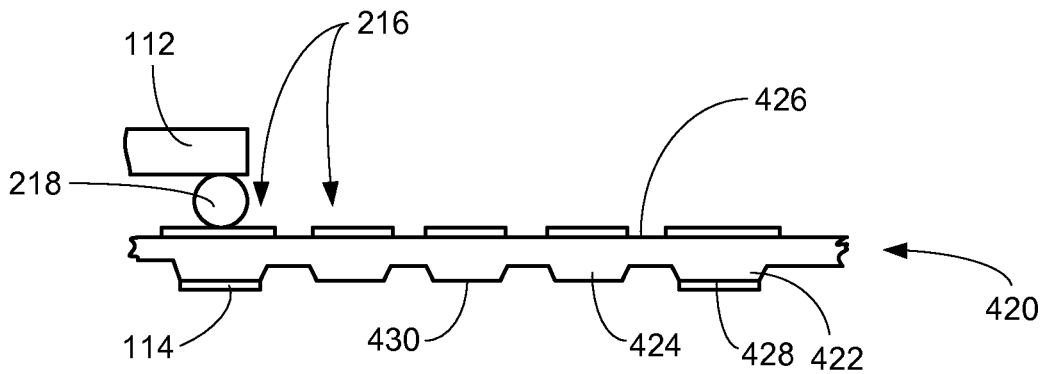
FIG. 4 is a cross-sectional view of a portion of the integrated circuit packaging system of FIG. 2 in a die mounting phase of manufacture.

Referring now to FIG. 4, therein is shown a cross-sectional view of a portion of the integrated circuit packaging system 100 of FIG. 2 in a die mounting phase of manufacture. A leadframe 420 is shown having instances of the contact pad 114 on contact protrusions 422 of the leadframe 420 surrounding support leads 424. The leadframe 420 is a conductive structure that can be formed by various processes. For example, the leadframe 420 can be formed by processes such as stamping, cutting, casting, etching, laser ablation, or a combination thereof.

The leadframe 420 is shown having the conductive pattern 216 directly on a top frame surface 426 of the leadframe 420. The integrated circuit die 112 can be connected to the conductive pattern 216 through the internal interconnects 218. The leadframe 420 can be a solid structure without holes and can be formed with protrusions such as the contact protrusions 422 and the support leads 424 that correspond to the contact leads 102 of FIG. 2 and the lead bumps 106 of FIG. 2 after further processing, respectively. A bottom surface of the leadframe 420 can be half-etched or partially removed to form the protrusions.

The leadframe 420 can have a characteristic configuration of the partially removed portions of the leadframe 420. For example, the partially removed portions of the leadframe 420 between the contact protrusions 422 and the support leads 424 can be the same depth with the contact protrusions 422 and the support leads 424 evenly spaced in order to ensure a later etching process removes material evenly.

The contact protrusions 422 are defined as protrusions of the leadframe 420 having the contact pad 114. The contact protrusions 422 can have the contact pad 114 on a bottom contact surface 428. The contact protrusions 422 and the support leads 424 can extend substantially the same vertical distance from the conductive pattern 216.

The support leads 424 are defined as the protrusions of the leadframe 420 without the contact pad 114. The support leads 424 are used as structural support for parts of the leadframe 420 with spacing between the contact protrusions 422 during a later molding process. A bottom support surface 430 of the support leads 424 can be coplanar with the bottom contact surface 428 of the contact protrusions 422.

For illustrative purposes, the conductive pattern 216 is shown directly above each of the support leads 424, though it is understood that the conductive pattern 216 can have a different configuration. For example, the conductive pattern 216 does not need to correspond to the support leads 424, and the support leads 424 can be positioned to not contact the conductive pattern 216 at all.

The contact pad 114 can be on the bottom contact surface 428 of the contact protrusions 422. The thickness of the contact pad 114 can be thin enough so that even with the contact pad 114, the contact protrusions 422 are substantially the same height as the support leads 424.

For illustrative purposes, the contact protrusions 422 and the support leads 424 are shown as the same size though it is understood that the contact protrusions 422 and the support leads 424 can be different sizes. For example, the support leads 424 can be smaller than the contact protrusions 422 to allow for ease of later removal.

As an example, the support leads 424 can be in any region between the contact protrusions 422 with a spacing between the contact protrusions 422 greater than 0.65 mm. This example assumes that the contact protrusions 422 have a pitch of 0.50 mm given a 0.35 mm horizontal size of each of the contact protrusions 422, and the leadframe 420 having a thickness of about 0.102 mm, with a molding pressure during application of the encapsulation 110 of 0.8 to 1.3 tons. In other words, the support leads 424 can be in any region between the contact protrusions 422 larger than the space than would be taken up by one of the contact protrusions 422.

Figure 5:
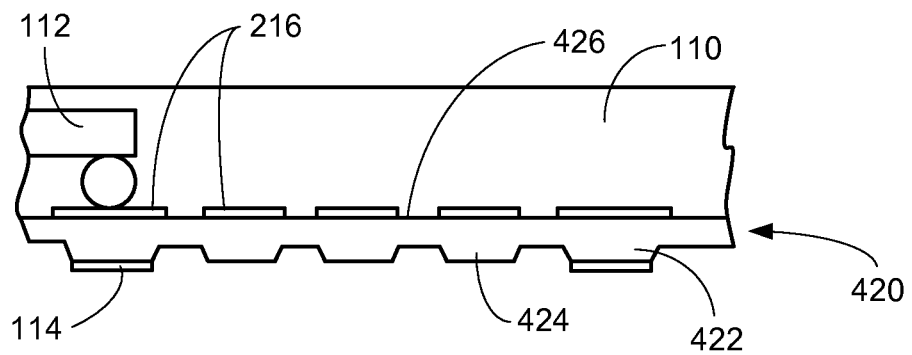
FIG. 5 is the structure of FIG. 4 in an encapsulation phase.

Referring now to FIG. 5, therein is shown the structure of FIG. 4 in an encapsulation phase. In the encapsulation phase, the leadframe 420 can be placed in a mold (not shown) having a flat bottom, and the support leads 424 can contact the mold at substantially the same distance from the conductive pattern 216 as the contact protrusions 422. Following placement in the mold, the top frame surface 426 of the leadframe 420, the integrated circuit die 112, and the conductive pattern 216 can be encapsulated in the encapsulation 110.

The support leads 424 can provide structural support for the portions of the leadframe 420 without the contact protrusions 422 which would otherwise, for example, be half-etched or thinned, during application of the encapsulation 110. For example, the encapsulation 110 can be applied under high temperature and pressure, which could cause thinned portions of the leadframe 420 to bow or bulge under the pressure, but the support leads 424 can support the leadframe 420 and prevent warping of the leadframe 420 and the conductive pattern 216.

Following the application of the encapsulation 110, at least a portion of the support leads 424 and other portions of the leadframe 420 can be removed from around the contact protrusions 422 to isolate and form the contact leads 102 of FIG. 2 in a removal phase, also exposing at least a portion of the bottom of the encapsulation 110. For example, the removal phase can utilize a removal process such as etching, grinding, or laser ablation. Also for example, if an etching process is used, the contact pad 114 can resist the etching process, resulting in a characteristic shape of the contact leads 102, which can be wider at the top than the bottom, curved on the sides, and have a rough texture on the sides.

The removal process can be carefully controlled and stopped as soon as the support leads 424 are physically and electrically isolated from each other, leaving the lead bumps 106 of FIG. 2 on the conductive pattern 216. Alternatively, for example, the removal process can continue until the lead bumps 106 have been fully removed and the conductive pattern 216 is exposed to form the integrated circuit packaging system 300 of FIG. 3.

The removal process can leave marks or residue characteristic of the process used. For example, the etching process can leave a rough or patterned texture on surfaces of the encapsulation 110, the lead bumps 106 if present, and the sides of the contact leads 102. Also for example, a laser ablation process can leave melted or burned residue of the leadframe 420 or the encapsulation 110, or both.

The dielectric layer 232 of FIG. 2 can be applied in an optional step to cover the bottom surface of the encapsulation 110, the conductive pattern 216, and at least a portion of the sides of the contact leads 102, in a protection phase.

It has been discovered that the support leads 424 extending the same distance from the conductive pattern 216 as the contact leads 102 neutralizes the molding pressure of the encapsulation 110, prevents warping of partially removed areas of the leadframe 420 without the contact pad 114, and increases manufacturing yield. For example, the support leads 424 act as pillars to maintain the structural integrity of the leadframe 420 against the high pressure of the molding process and prevent warping, bowing, or bulging of the leadframe 420 and the conductive pattern 216.

It has also been discovered that the support leads 424 extending the same distance from the conductive pattern 216 as the contact leads 102 protects the integrated circuit die 112 from breakage. For example, without the support leads 424, the leadframe 420 can bulge or deform during the molding process which can move traces of the conductive pattern 216, warp the leadframe 420, or break the integrated circuit die 112. However, with the support leads 424, the structural integrity of the leadframe 420 can be preserved due to the physical support the support leads 424 provide, and the integrated circuit die 112 can be protected from cracking or breaking.

Figure 6:
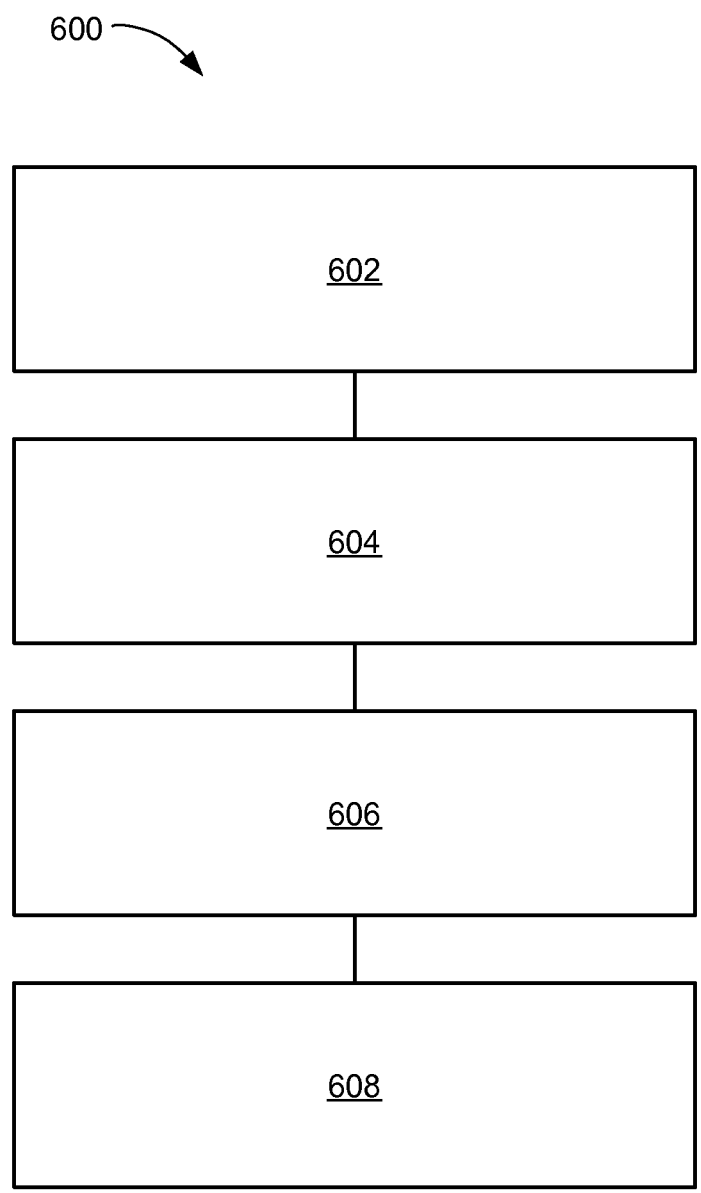
FIG. 6 is a flow chart of a method of manufacture of an integrated circuit packaging system in a further embodiment of the present invention.

Referring now to FIG. 6, therein is shown a flow chart of a method 600 of manufacture of an integrated circuit packaging system in a further embodiment of the present invention. The method 600 includes: providing a leadframe having a partially removed portion including: a conductive pattern having a lower surface on a top frame surface of the leadframe, a contact protrusion and a support lead on the lower surface of the conductive pattern, the support lead for supporting the partially removed portion of the leadframe during an encapsulation process, and a contact pad on a bottom surface of the contact protrusion in a block 602; mounting an integrated circuit die above the conductive pattern in a block 604; applying an encapsulation on the integrated circuit die and the conductive pattern, the lower surface of the conductive pattern exposed from the encapsulation in a block 606; and removing at least a portion of the leadframe to form a contact lead and expose a bottom surface of the encapsulation in a block 608.

Thus, it has been discovered that the integrated circuit packaging system and the support leads of the present invention furnish important and heretofore unknown and unavailable solutions, capabilities, and functional aspects for preventing damage to the integrated circuit die during the molding process. For example, because the leadframe is physically supported during the molding process by the support leads, the leadframe is prevented from bulging or deforming under pressure, and stress on the conductive pattern and the integrated circuit die is avoided.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising: forming a conductive pattern having a lower surface, a trace, and a pad; mounting an integrated circuit die above the conductive pattern; applying an encapsulation on the integrated circuit die and the conductive pattern, the lower surface of the conductive pattern is exposed from the encapsulation, a bottom surface of the encapsulation is coplanar with the lower surface of the conductive pattern; forming a contact structure having the pad, a contact lead on the lower surface of the pad, and a contact pad on a bottom surface of the contact lead, the contact structure has a contact top surface and a contact thickness, the contact lead is laterally spaced away from the integrated circuit die, a top surface of the contact lead is on the same plane as the bottom surface of the encapsulation; and forming a trace structure having the trace, a trace top surface, and a trace thickness, the trace top surface is coplanar with the contact top surface, the trace thickness is less than the contact thickness.

2. The method as claimed in claim 1 wherein: forming the contact structure includes providing a leadframe the having a contact protrusion, the contact protrusion has a bottom contact surface; and, forming the trace structure includes providing a leadframe having a support lead, the support lead has a bottom support surface, the bottom contact surface is coplanar with the bottom support surface.

3. The method as claimed in claim 1 wherein mounting the integrated circuit die includes connecting an internal interconnect to the integrated circuit die and the conductive pattern.

4. The method as claimed in claim 1 wherein forming the trace structure includes providing a leadframe having a support lead and removing a portion of the support lead to leave a lead bump on the conductive pattern.

5. The method as claimed in claim 1 wherein forming the trace structure includes providing a leadframe having a support lead and removing the support lead to expose the lower surface of the conductive pattern in a recessed area of an external lead array.

6. A method of manufacture of an integrated circuit packaging system comprising: providing a leadframe having a partially removed portion including: forming a conductive pattern having a lower surface, a trace, and a pad; mounting an integrated circuit die above the conductive pattern; connecting the integrated circuit die and the conductive pattern by an internal interconnect; applying an encapsulation on the integrated circuit die and the conductive pattern, the lower surface of the conductive pattern is exposed from the encapsulation, a bottom surface of the encapsulation is coplanar with the lower surface of the conductive pattern; forming a contact structure having the pad, a contact lead on the lower surface of the pad, and a contact pad on a bottom surface of the contact lead, the contact structure has a contact top surface and a contact thickness, the contact lead is laterally spaced away from the integrated circuit die, a top surface of the contact lead is on the same plane as the bottom surface of the encapsulation; and forming a trace structure having the trace, a trace top surface, and a trace thickness, the trace top surface is coplanar with the contact top surface, the trace thickness is less than the contact thickness.

7. The method as claimed in claim 6 wherein forming the contact structure includes providing a leadframe having a contact protrusion and removing at least a portion of the contact protrusion using an etching process.

8. The method as claimed in claim 6 wherein forming the contact structure having the contact pad includes providing a leadframe having contact protrusions and forming an array of a plurality of the contact pad on the contact protrusions.

9. The method as claimed in claim 6 wherein forming the trace structure includes providing a leadframe having a support lead and removing a portion of the support lead to leave a lead bump on the conductive pattern, the lead bump having a textured surface characteristic of an etching process.

10. The method as claimed in claim 6 wherein applying the encapsulation includes exposing the bottom surface of the encapsulation by removing at least a portion of a leadframe and the bottom surface having a textured surface characteristic of an etching process.

11. An integrated circuit packaging system comprising: a conductive pattern having a lower surface, a trace, and a pad; an integrated circuit die mounted above the conductive pattern; an encapsulation on the integrated circuit die and the conductive pattern, the lower surface of the conductive pattern exposed from a bottom surface of the encapsulation, the bottom surface of the encapsulation coplanar with the lower surface of the of the conductive pattern; a contact structure having the pad, a contact lead on the lower surface of the pad, and a contact pad on a bottom surface of the contact lead, the contact structure having a contact top surface and a contact thickness, the contact lead laterally spaced away from the integrated circuit die, a top surface of the contact lead on the same plane as the bottom surface of the encapsulation; and a trace structure having the trace, a trace top surface, and a trace thickness, the trace top surface coplanar with the contact top surface, the trace thickness is less than the contact thickness.

12. The system as claimed in claim 11 further comprising a side of the contact lead having a textured surface.

13. The system as claimed in claim 11 further comprising an internal interconnect connected to the integrated circuit die and the conductive pattern.

14. The system as claimed in claim 11 further comprising a lead bump on the lower surface of the conductive pattern.

15. The system as claimed in claim 11 wherein the lower surface of the conductive pattern is exposed in a recessed area of an external lead array.

16. The system as claimed in claim 11 further comprising:
an internal interconnect connected to the integrated circuit die and the conductive pattern; and
a lead bump on the lower surface of the conductive pattern.

17. The system as claimed in claim 16 wherein the lead bump has a convex shape.

18. The system as claimed in claim 16 further comprising an array of a plurality of the contact lead in a contact lead area of an external lead array.

19. The system as claimed in claim 16 wherein the lead bump has a textured surface.

20. The system as claimed in claim 16 wherein the bottom surface of the encapsulation has a textured surface.

* * * * *